(12) United States Patent
Larzul

(10) Patent No.: US 9,959,376 B2
(45) Date of Patent: *May 1, 2018

(54) ISOLATED DEBUGGING IN AN FPGA BASED EMULATION ENVIRONMENT

(71) Applicant: Synopsys, Inc., Mountain View, CA (US)

(72) Inventor: Ludovic Marc Larzul, Folsom, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/464,181

(22) Filed: Mar. 20, 2017

(65) Prior Publication Data

US 2017/0193146 A1 Jul. 6, 2017

Related U.S. Application Data

(63) Continuation of application No. 14/745,239, filed on Jun. 19, 2015, now Pat. No. 9,684,743.

(51) Int. Cl.
*G06F 17/50* (2006.01)

(52) U.S. Cl.
CPC ........ *G06F 17/5027* (2013.01); *G06F 17/505* (2013.01); *G06F 17/5054* (2013.01); *G06F 17/5031* (2013.01)

(58) Field of Classification Search
CPC ............. G06F 17/5031; G06F 17/5054; G06F 17/505; G06F 17/5027
See application file for complete search history.

(56) References Cited

U.S. PATENT DOCUMENTS

| 5,960,191 A * | 9/1999 | Sample .............. G01R 31/2853 703/23 |
| 6,132,109 A | 10/2000 | Gregory et al. |
| 6,240,376 B1 | 5/2001 | Raynaud et al. |
| 6,336,087 B2 | 1/2002 | Burgun et al. |
| 7,035,787 B2 | 4/2006 | Reblewski |
| 7,072,825 B2 | 7/2006 | Wang et al. |

(Continued)

OTHER PUBLICATIONS

United States Office Action, U.S. Appl. No. 14/745,239, dated Aug. 31, 2016, 12 pages.

*Primary Examiner* — Naum B Levin
(74) *Attorney, Agent, or Firm* — Fenwick & West LLP

(57) ABSTRACT

For a design under test (DUT) that is to be emulated, a host system partitions the DUT into multiple partitions and maps each partition to an FPGA of an emulator which will emulate the partition. The host system stores information describing to which FPGAs each component of the DUT has been mapped. Additionally, mapped to each FPGA is trace and injection logic that traces signals exchanged by the FPGA with other FPGAs during emulation of the DUT. After the emulation of the DUT is complete, if a user wishes to debug a component of the DUT, the FPGAs that are configured to emulate the component are identified. For each identified FPGA, the trace and injection logic injects previously traced signals into the logic of the FPGA in order to reemulate the component. The host system generates waveforms for the user that include signals traced during the reemulation of the component.

20 Claims, 5 Drawing Sheets

(56) References Cited

U.S. PATENT DOCUMENTS

| | | | |
|---|---|---|---|
| 7,075,310 B2 * | 7/2006 | Mason, Jr. | G01R 31/085 324/512 |
| 7,093,174 B2 | 8/2006 | Fenech Saint Genieys | |
| 7,137,078 B2 | 11/2006 | Singhal et al. | |
| 7,257,802 B2 | 8/2007 | Daw et al. | |
| 7,337,104 B2 | 2/2008 | Engel | |
| 7,366,652 B2 | 4/2008 | Wang et al. | |
| 7,379,861 B2 | 5/2008 | Kfir et al. | |
| 7,424,416 B1 | 9/2008 | Cavanagh | |
| 7,480,609 B1 * | 1/2009 | Cavanagh | G06F 17/5027 703/16 |
| 7,721,036 B2 | 5/2010 | Poplack | |
| 7,739,093 B2 | 6/2010 | Beausoleil et al. | |
| 7,941,771 B2 * | 5/2011 | Kaszynski | G06F 17/5022 703/14 |
| 8,000,950 B2 | 8/2011 | Hira et al. | |
| 8,165,866 B2 | 4/2012 | Cha et al. | |
| 8,281,280 B2 | 10/2012 | Chang | |
| 8,732,650 B2 | 5/2014 | Chang et al. | |
| 8,739,089 B2 | 5/2014 | Chiu et al. | |
| 8,839,179 B2 * | 9/2014 | Chang | G06F 17/5081 716/106 |
| 8,997,034 B2 | 3/2015 | Chang | |
| 9,026,966 B1 | 5/2015 | Ramachandran et al. | |
| 9,262,567 B2 | 2/2016 | Durand et al. | |
| 9,286,424 B1 | 3/2016 | Larzul et al. | |
| 9,449,138 B2 | 9/2016 | Chang et al. | |
| 9,547,040 B2 | 1/2017 | Larzul | |
| 9,547,739 B2 | 1/2017 | Larzul | |
| 9,684,743 B2 * | 6/2017 | Larzul | G06F 17/5009 |
| 2004/0078179 A1 * | 4/2004 | Fuji | G06F 17/5027 703/15 |
| 2008/0046228 A1 | 2/2008 | Cha et al. | |
| 2009/0248390 A1 | 10/2009 | Durand et al. | |
| 2012/0166168 A1 | 6/2012 | Srinivasan | |
| 2013/0024178 A1 * | 1/2013 | Kumaragurunathan | G06F 17/5027 703/14 |
| 2014/0032204 A1 | 1/2014 | Suresh et al. | |
| 2014/0052430 A1 | 2/2014 | Suresh et al. | |
| 2015/0227662 A1 | 8/2015 | Lepercq | |
| 2016/0098504 A1 | 4/2016 | Larzul et al. | |
| 2016/0098505 A1 | 4/2016 | Larzul | |
| 2016/0217235 A1 | 7/2016 | Rabinovitch et al. | |
| 2016/0217236 A1 | 7/2016 | Rabinovitch et al. | |
| 2016/0314232 A1 | 10/2016 | Larzul | |
| 2016/0342725 A1 | 11/2016 | Larzul | |

* cited by examiner

ISOLATED DEBUGGING IN AN FPGA BASED EMULATION ENVIRONMENT

CROSS-REFERENCE TO RELATED APPLICATION

This application is a continuation application of U.S. patent application Ser. No. 14/745,239, filed Jun. 19, 2015, now U.S. Pat. No. 9,684,743, which is incorporated by reference herein in its entirety.

BACKGROUND

1. Field of Art

The disclosure generally relates to the emulation of circuits, and more specifically to debugging an emulated design under test (DUT).

2. Description of the Related Art

Emulators and prototyping boards have been developed to assist circuit designers in designing and debugging highly complex integrated circuits (e.g. CPUs, GPUs, or SOC). An emulator includes multiple reconfigurable components, such as field programmable gate arrays (FPGAs), which together can imitate the operations of a design under test. By using an emulator to imitate the operations of a DUT, designers can verify that a DUT complies with various design requirements prior to fabrication.

Debugging a DUT involves iteratively emulating the DUT in order to obtain waveforms of signals from the emulated DUT. These waveforms are analyzed for errors and discrepancies. Each emulation run requires use of all of the emulator's hardware resources (e.g., thousands of hardware components). The more complex a DUT gets, the more complex the required tests are to verify it. This complexity leads to an emulation run that can take multiple hours or days. Since debugging typically involves multiple emulation runs, debugging a DUT is very time consuming and expensive in terms of resources.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
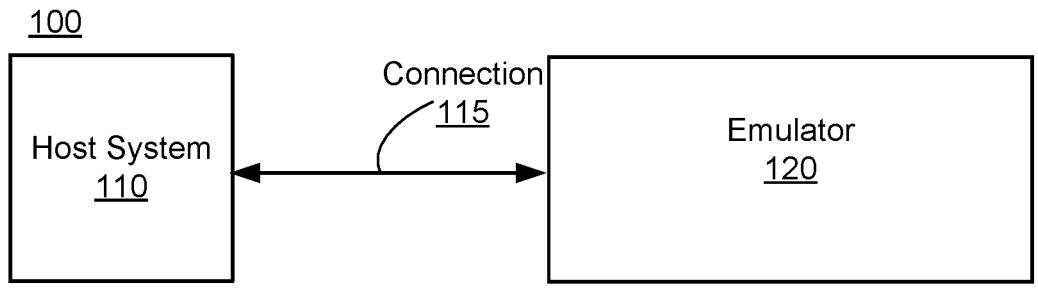
FIG. 1 is a block diagram of an emulation environment, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

The figures use like reference numerals to identify like elements. A letter after a reference numeral, such as "102A," indicates that the text refers specifically to the element having that particular reference numeral. A reference numeral in the text without a following letter, such as "120," refers to any or all of the elements in the figures bearing that reference numeral.

Configuration Overview

A disclosed system (and method and computer program product) includes an emulation environment that performs efficient debugging of an integrated circuit by reducing the number of emulator hardware resources needed for the debugging process.

One embodiment of the emulation environment includes a host system and an emulator. The host system configures the emulator to emulate a design under test (DUT), and the emulator emulates the DUT using multiple field programmable gate arrays (FPGA). For a DUT that is to be emulated, the host system partitions the DUT into multiple partitions and maps each partition to an FPGA which will emulate the partition. A component (may also be referred to as a "subsystem") of the DUT (e.g., central processing unit, graphics processing unit, peripheral component interface) may be mapped to one or more FPGAs (may be part of a single partition or comprised of multiple partitions). The host system transmits bit files to the emulator to configure the FPGAs to emulate the DUT. Additionally, the host system stores information describing to which FPGAs each component of the DUT has been mapped.

Typically an emulator has multiple FPGAs organized into modules or boards. The boards implementing the DUT are typically all identical and the configuration of the FPGAs makes them behave differently to reproduce globally the DUT behavior.

In one embodiment, mapped to each FPGA is trace and injection logic that traces interface signals exchanged by the FPGA with other FPGAs during emulation of the DUT. After the emulation of the DUT is complete, if a user wishes to debug a sub-system of the DUT, the user identifies the sub-system and selects a time period of the emulation to debug (selects a debug window). The host system identifies the FPGAs that are configured to emulate the selected sub-system of the DUT. For each identified FPGA, the trace and injection logic injects the interface signals traced during the selected time period in order to reemulate the component. The host system generates waveforms for the user that include signals traced during the reemulation of the component.

Hence, to debug a component the emulator only has to run the FPGAs to which the component is mapped instead of having to rerun all of the emulator FPGAs as is typically done. This makes debugging much more resource and time efficient. As each FPGA is made independent from the rest of the DUT, the rerun can be done in parallel or in sequence or a mix.

This method of debug may be used with an emulation "farm" (i.e. a group of emulators used as a set of resources shared among different users and running many jobs). As a farm may have emulation resources left over, they can be used to rerun a given DUT to create debug information without having to wait for all the resources required by a DUT to be available. Only one available FPGA is needed to start creating the debug information.

Although each FPGA is described as including trace and injection logic, it should be understood that in other embodiments a group of FPGAs may share trace and injection logic. In this embodiment the trace and injection logic traces interface signals exchanged by the group of FPGAs and may inject to one or more FPGAs from the group traced interface signals.

Example Emulation Environment

FIG. 1 is a block diagram illustrating an emulation environment 100, according to one embodiment. The emulation environment 100 includes a host system 110 and an emulator 120. The host system 110 communicates with the emulator 120 through a connection 115.

The connection 115 is a communication medium that allows communication between the host system 110 and the emulator 120. In one embodiment, the connection 115 is one or more cables with electrical connections. For example, the connection 115 may be one or more RS232, USB, LAN, optical, or custom built cables. In other embodiment, the connection 115 is a wireless communication medium or a network with one or more points of access. For another example, the connection 115 may be a wireless communication medium employing a Bluetooth® or IEEE 802.11 protocol.

The emulator 120 is a hardware system that emulates DUTs. A DUT is one or more circuit designs that are to be emulated by the emulator 120. The emulator 120 includes multiple FPGAs. Each FPGA includes one or more FPGA interfaces through which the FPGA is connected to other FPGAs of the emulator 120 (and potentially other emulator hardware components). Hence, an FPGA exchanges signals with other FPGAs through one or more FPGA interfaces. An FPGA interface may also be referred to as an input/output pin or an FPGA pad. Although, the emulator 120 is described here as including FPGAs, it should be understood that in other embodiments the emulator 120 may include other types of reconfigurable logic blocks instead of the FPGAs for emulating DUTs, like custom FPGAs and specialized ASICs for emulation or prototyping.

For a DUT that is to be emulated, the emulator 120 receives from the host system 110 one or more bit files including a description of the DUT. The bit files further describe partitions of the DUT created by the host system 110 with trace and injection logic, mappings of the partitions to the FPGAs of the emulator 120, and design constraints. Based on the bit files, the emulator 120 configures the FPGAs to perform the functions of the DUT. In one embodiment, one or more FPGAs of the emulator 120 already have the trace and injection logic built into the silicon of the FPGA. Hence, in this embodiment, the FPGAs don't have to be configured by the host system 110 to emulate trace and injection logic because the logic is already included.

The host system 110 generates information to configure the emulator 120 to emulate a DUT. The host system 110 may be a single computer or a collection of multiple computers. In the embodiment where the host system 110 is comprised of multiple computers, the functions described herein as being performed by the host system 110 may be distributed among the multiple computers. Further, the host system 110 may be indirectly connected to the emulator 120 through another device, computer or network.

The host system 110 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system 110 synthesizes the DUT description to create a gate level netlist based on the DUT description. The host system 110 uses the netlist of the DUT to partition the DUT into multiple partitions. In one embodiment, in each partition the DUT includes trace and injection logic. The trace and injection logic traces interface signals exchanged via the interfaces of an FPGA. Additionally, the trace and injection logic can be used to inject traced interface signals into the logic of the FPGA. The host system 110 maps each partition to an FPGA of the emulator 120. In another embodiment, the trace and injection logic is only included in select partitions for a group of FPGAs. In another embodiment, the trace and injection logic is not included in partitions because it is already built into FPGAs of the emulator 120

In one embodiment, the host system 110 creates bit files describing each partition of the DUT and the mapping of the partitions to the FPGAs. For partitions in which trace and injection logic was incorporated the bit files also describe the incorporation of the logic. The bit files may also include place and route information and design constraints. The host system 110 stores the bit files and also stores for components of the DUT information describing which FPGAs are to emulate each component of the DUT (to which FPGAs each component is mapped).

Upon request, the host system transmits the bit files to the emulator 120. The host system 110 instructs the emulator 120 to emulate the DUT. During emulation of the DUT or at the end of the emulation, the host system 110 receives emulation results from the emulator 120 through the connection 115. Emulation results are information generated by the emulator 120 based on the emulation of the DUT. The emulation results include interface signals (states of interface signals) traced by the trace and injection logic of each FPGA. The host system 110 stores the emulation results.

After emulation of the DUT, a user may request to debug a component of the DUT. If such a request is made the user may provide a time period of the emulation to debug. The host system 110 identifies which FPGAs are configured to emulate the component based on the stored information. The host system 110 retrieves stored interface signals associated with the time period and traced by the trace and injection logic of each identified FPGA. The host system 110 instructs the emulator 120 to rerun the identified FPGAs, either one by one, multiple at a time, or altogether. The host system 110 transmits the retrieved interface signals to the emulator 120 in order to reemulate the component for the time period. The trace and injection logic of each identified FPGA injects its respective interface signals received from the host system 110 into the logic of the DUT mapped to the FPGA. In case the run of each identified FPGA is done in multiple reruns, the result may be merged all together to have a full debug view.

The host system 110 receives from the emulator 120 signals traced by logic of the identified FPGAs during the reemulation of the component. The host system 110 stores the signals received from the emulator 120. In one embodiment, the signals traced during the reemulation have a higher sampling rate than during the initial emulation. For example, in the initial run a traced signal may be comprised of a saved hardware state every X milliseconds. However, in the reemulation the traced signal may be comprised of a saved hardware state every Y milliseconds, where Y is less than X. If the user requests to view a waveform of a signal traced during the reemulation, the host system 110 retrieves the stored signal and displays a plot of the signal (generates a waveform of the signal). Afterwards the user can, for example, request to reemulate the same component but for a different time period or to reemulate another component.

Figure 2:
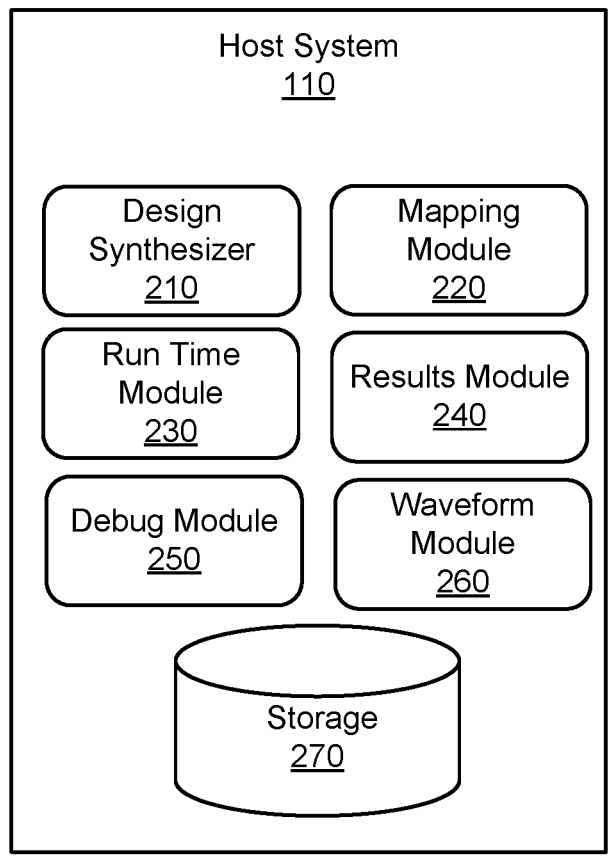
FIG. 2 is a block diagram illustrating a host system, according to one embodiment.

FIG. 2 is a block diagram illustrating the host system 110 in more detail, according to one embodiment. The host system 110 includes a design synthesizer 210, mapping module 220, run time module 230, results module 240, debug module 250, waveform module 260, and storage 270. Each of these components may be embodied as hardware, software, firmware, or a combination thereof. Together these components configure the emulator 120, and monitor the emulation results.

The design synthesizer 210 converts the HDL of a DUT into gate level logic. For a DUT that is to be emulated, the design synthesizer 210 receives a description of the DUT. If the description of the DUT is fully or partially in HDL (e.g., RTL or other level of abstraction), the design synthesizer 210 synthesizes the HDL of the DUT to create a gate level netlist with a description of the DUT in terms of gate level logic.

The mapping module 220 partitions DUTs and maps partitions to emulator FPGAs. The mapping module 220 partitions a DUT at the gate level into a number of partitions using the netlist of the DUT. For each partition, the mapping module 220 retrieves a gate level description of the trace and injection logic and incorporates the logic into the partition. As described above, the trace and injection logic included in a partition is configured to trace signals exchanged via the interfaces of an FPGA to which the partition is mapped (trace interface signals). In another embodiment, the trace and injection logic is incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In one embodiment, in addition to including the trace and injection logic, the mapping module 220 may include additional tracing logic in a partition in order to trace the states of certain DUT components that are not traced by the trace and injection logic (to trace signals other than the interface signals traced by the trace and injection logic). The mapping module 220 may include the additional tracing logic in the DUT prior to the partitioning or in partitions after the partitioning. In other embodiments, the design synthesizer 210 includes the additional tracing logic in an HDL description of the DUT prior to synthesizing the description.

The mapping module 220 maps each partition of the DUT to an FPGA of the emulator 120. The mapping module 220 performs the partitioning and mapping using design rules, design constraints (e.g., timing or logic constraints), and information about the emulator 120. For components of the DUT, the mapping module 220 stores information in the storage 270 describing which FPGAs are to emulate each component.

Based on the partitioning and the mapping, the mapping module 220 generates one or more bit files that describe the created partitions and the mapping of logic to each FPGA of the emulator 120. The bit files may include additional information, such as constraints of the DUT, and routing information of connections between FPGAs and connections within each FPGA. In one embodiment, the mapping module 220 generates a bit file for each partition of the DUT. In one embodiment, the bit files are stored in the storage 270. Upon request from a user, the mapping module 220 transmits the bit files to the emulator 120 for the emulator 120 to configure the FPGAs to emulate the DUT.

In one embodiment, if the emulator 120 includes specialized ASICs that include the trace and injection logic, the mapping module 220 may generate a specific configuration allowing to connect them to the DUT or just save the information of what traced/injected signal is and where the information is stored on the specialized ASIC.

The run time module 230 controls emulations performed on the emulator 120. The run time module 230 may cause the emulator 120 to start or stop executing an emulation. Additionally, the run time module 230 may provide input signals/data to the emulator 120. The input signals may be provided directly to the emulator 120 through the connection 115 or indirectly through other input signal devices. For example, the host system 110 with the run time module 230 may control an input signal device to provide the input signals to the emulator 120. The input signal device may be, for example, a test board (directly or through cables), signal generator, another emulator, or another host system.

The results module 240 processes emulation results generated by the emulator 120. During emulation and/or after completing the emulation, the results module 240 receives emulation results from the emulator 120 generated during the emulation. The emulation results include signals traced during the emulation. Specifically, the emulation results include interface signals traced by the trace and injection logic emulated by each FPGA. The emulation results may also include signals traced by additional logic included in the DUT. In one embodiment, each traced signal spans multiple cycles of the emulation. A traced signal is comprised of multiple hardware states and each hardware state is associated with a time of the emulation. The results module 240 stores the traced signals received in the storage 270. With each stored signal, the results module 240 stores information indicating which FPGA generated the traced signal.

The debug module 250 allows users to debug DUT components. After the emulator 120 has emulated a DUT and the results module 240 has received the interface signals traced by the trace and injection logic during the emulation, a user may request to debug a component of the DUT by reemulating the component for a specific time period. In a request to debug a component, the user identifies the component and indicates a time period of the emulation to debug. In one embodiment, the request also include a sampling rate that indicates how often hardware states should be saved by logic that traces signals.

The debug module 250 identifies the one or more FPGAs of the emulator 120 that are configured to emulate the component based on the information stored by the mapping module 220 in the storage 270. For each identified FPGA, the debug module 250 retrieves from the storage 270 interface signals traced by the trace and injection logic of the FPGA during the time period indicated by the user (i.e., retrieve hardware states traced by the trace and injection logic that are associated with the time period).

The debug module 250 transmits the retrieved interface signals to the emulator 120. The debug module 250 instructs the debug module 250 to run the identified FPGAs and for the trace and injection logic of each identified FPGA to inject its respective traced signals into logic of the FPGA in order to reemulate the component for the requested time period. In one embodiment, the debug module 250 also transmits the sampling rate provided by the user to the emulator 120 so that the tracing logic traces hardware states at the proper intervals.

Hence, to debug the component, the emulator 120 only has to run the FPGAs to which the component has been mapped. Additionally, the reemulation of the component does not have to start from the beginning and can start at any point desired by the user.

In another embodiment, for an identified FPGA the debug module 205 transmits instructions to the emulator to load multiple emulator FPGAs with the same configuration of the identified FPGA. The debug module 205 additionally instructs the emulator 120 to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

In one embodiment, instead of a user indicating a specific component of the DUT to debug, a user may identify a hierarchy or a list of DUT signals to reemulate. In this embodiment, the debug module 250 determines the FPGA needed to emulate the hierarchy or list of signals, retrieves the necessary interface signals and transmits the retrieved interface signals to the emulator 120 for reemulation. Hence, a user can identify any element (e.g., component or signal) of the DUT to debug/reemulate.

The waveform module 260 generates waveforms based on traced signals. If a user requests to view a waveform of a signal traced during an emulation run, the host system 110 retrieves the signal from the storage 270. The waveform module 260 displays a plot of the signal to the user. In one embodiment, for one or more signals, when the signals are received from the emulator 120, the waveform module 260 automatically generates the plots of the signals.

Figure 3:
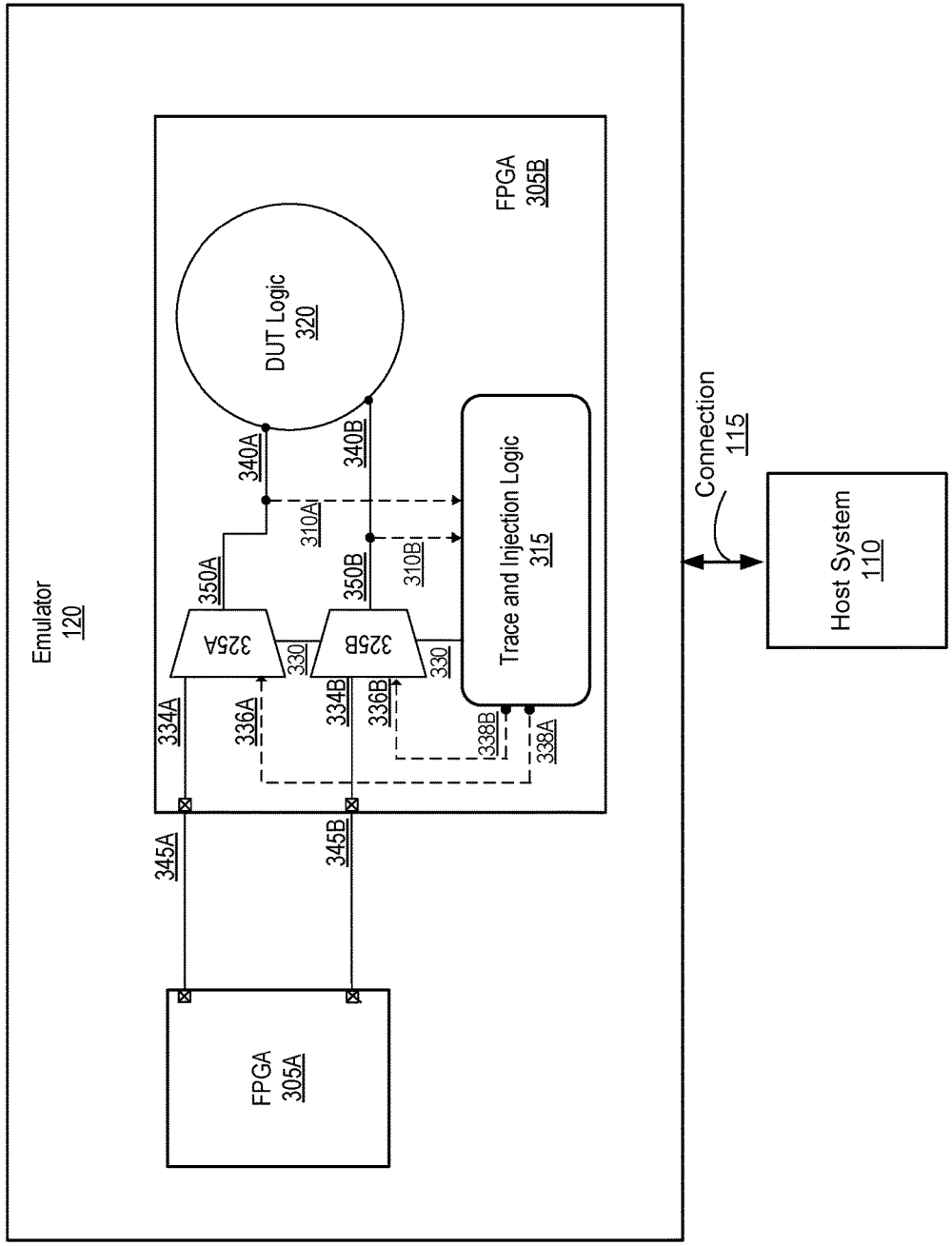
FIG. 3 is a circuit diagram a field programmable gate arrays (FPGA) that includes of trace and injection logic, according to one embodiment.

FIG. 3 is a block diagram that illustrates an example of logic mapped to an emulator FPGA according to one embodiment. The emulator 120 is illustrated as including two FPGAs 305A and 305B. It should be understood that in other embodiments the emulator 120 includes more FPGAs 305. It should also be understood that in other embodiments the FPGA 305 is actually a group of FPGAs or a subpart of an FPGA. Two FPGAs 305 are shown in this example for purposes of simplicity. FPGA 305B is connected to FPGA 305A via interfaces 345A and 345B. FPGA 305B receives signals from FPGA 305A via the interfaces 345.

Based on bit files provided by the host system 110, trace and injection logic 320 and logic 320 of a DUT (DUT logic 320) are mapped to the FPGA 305B. Additionally, multiplexers 325A and 325B are mapped to the FPGA 305B. The multiplexers 325 are used by the trace and injection logic 315 to inject interface signals into the DUT logic 320. A first input 334A of multiplexer 325A is connected to interface 345A and a second input 336A of the multiplexer 325A is connected to an output 338A of the trace and injection logic 315. An output 350A of the multiplexer 325A is connected to an input 340A of the DUT logic 320. Similarly, a first input 334B of multiplexer 325B is connected to interface 345B and a second input 336B of the multiplexer 325B is connected to an output 338B of the trace and injection logic 315. An output 350B of the multiplexer 325B is connected to an input 340B of the DUT logic 320. In other embodiments, additional multiplexers may be included to demultiplex the input 334 into multiple inputs.

Through control line 330 the trace and injection logic 315 controls whether the multiplexers 325 select the first input 334 or the second input 336 to output. When entire DUT is emulated (e.g., during the first emulation run), the trace and injection logic 315 outputs a first state via the control line 330. The first state causes the multiplexers 325 to output the interface signals received from FPGA 305A via the interfaces 345. The interface signals are received by the DUT logic 320 through the inputs 340. The trace and injection logic 315 traces the interface signals via trace lines 310A and 310B. The traced interface signals are transmitted to the host system 110 via connection 115.

When the emulator 120 receives from the host system 110 instructions to run FPGA 305B and receives traced signals previously traced by the logic 315 for reemulation of the DUT logic 320, the trace and injection logic 315 outputs a second state via the control line 330. Additionally, the trace and injection logic 315 outputs the traced signals received from the host system 110 to the respective multiplexers 325 that previously received the signals when they were traced. Based on the second state of the control line 330, the multiplexers 325 select the traced signals which are input into the DUT logic 320 through the inputs 340.

Figure 4:
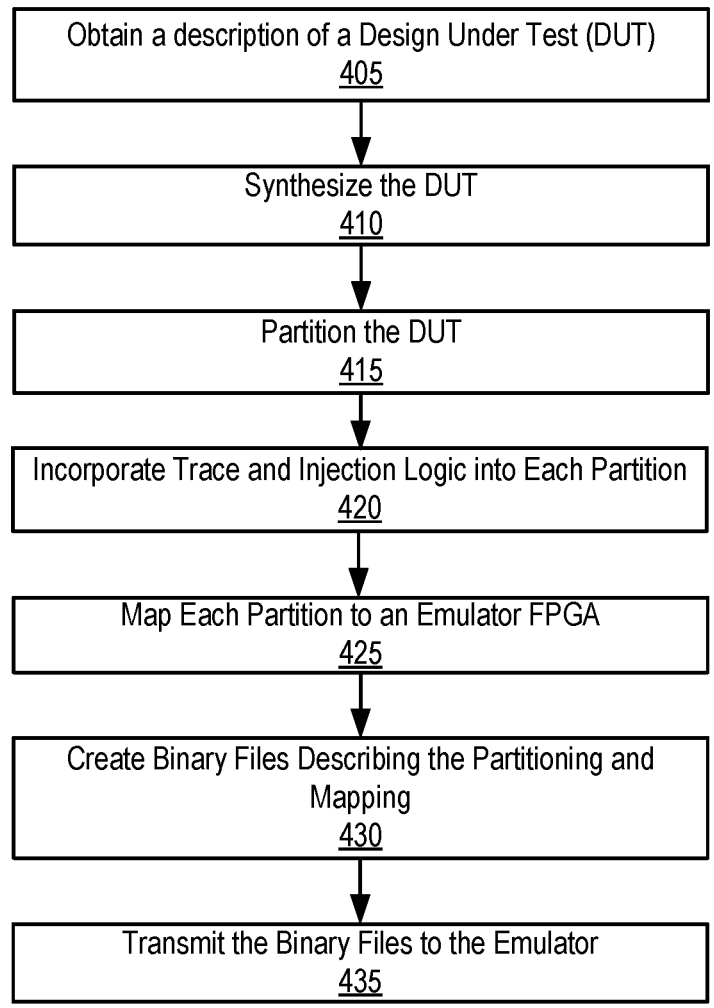
FIG. 4 is a flow chart illustrating the host system compiling a description of a DUT, according to one embodiment.

FIG. 4 is a flow chart illustrating the host system 110 compiling a description of a DUT according to one embodiment. Other embodiments can perform the steps of FIG. 4 in different orders. Moreover, other embodiments can include different and/or additional steps than the ones described here.

The host system 110 obtains 405 from a user a description of a DUT in HDL. The host system 110 synthesizes 410 the HDL description of the DUT to create a gate level netlist for the DUT. The host system 110 partitions 415 the DUT at the gate level into a number of partitions using the gate level netlist. The host system 110 incorporates 420 trace and injection logic 320 into each partition.

The host system 110 maps 425 each partition to an FPGA of the emulator 120. The host system 110 creates 430 binary files describing the partitioning and mapping of the partitions. The host system 110 transmits 435 the binary files to emulator 120 for the FPGAs to be configured to emulate the DUT.

Figure 5:
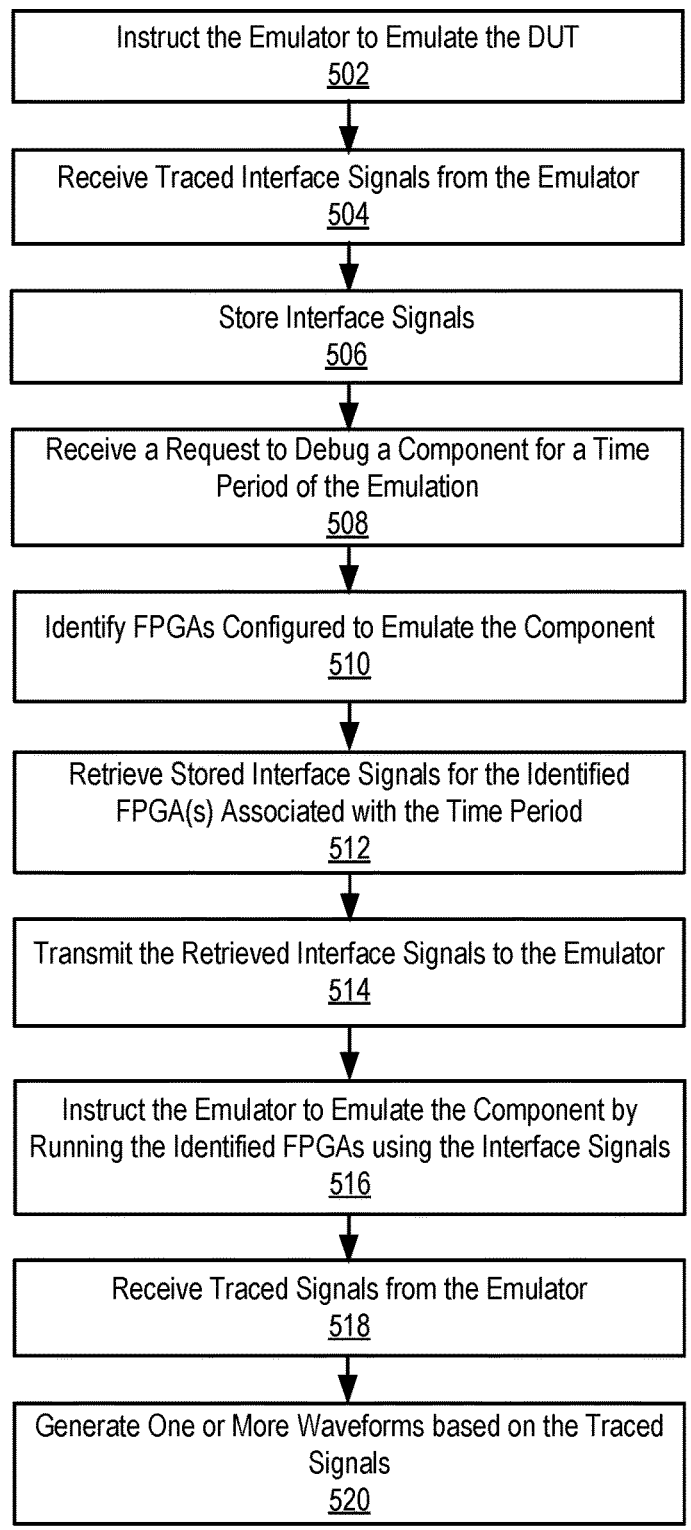
FIG. 5 is a flow chart illustrating a debug process of a DUT component, according to one embodiment.

FIG. 5 is a flow chart illustrating a debug process of a DUT component, according to one embodiment. Other embodiments can perform the steps of FIG. 5 in different orders. Moreover, other embodiments can include and/or additional step than the one described here, and all steps may not be done at one time.

Assume for purposes of this example that the emulator 120 has already been configured to emulate the DUT based on binary files transmitted to the emulator 120 by the host system 110 and that each FPGA includes trace and injection logic 315. The host system 110 instructs 502 the emulator 120 to emulate the DUT. The host system 110 receives 504 from the emulator 120 interface signals traced by the trace and injection logic during the emulation of the DUT. The host system 110 stores 506 the received interface signals.

The host system 110 receives 508 a request to debug a component of the DUT and time period of the emulation to debug. The host system 110 identifies 510 the emulator FPGAs that are configured to emulate the component. The host system 110 retrieves 512 stored interface signals generated by the identified FPGAs that are associated with the time period and transmits 514 the signals to the emulator 120. The host system 110 instructs 516 the emulator 120 to reemulate the component by running the identified FPGAs using the interface signals. The trace and injection logic of each identified FPGA interface injects its respective interface signals into the DUT logic mapped to the FPGA.

The host system 110 receives 518 from the emulator 120 signals traced during the reemulation of the component 505. The host system 110 generates 520 one of more waveforms based on the traced signals received. Steps 514 to 520 may be done multiple times up to the point when all the identified FPGAs are rerun to obtain all the debug information.

Computing Machine Architecture

Figure 6:
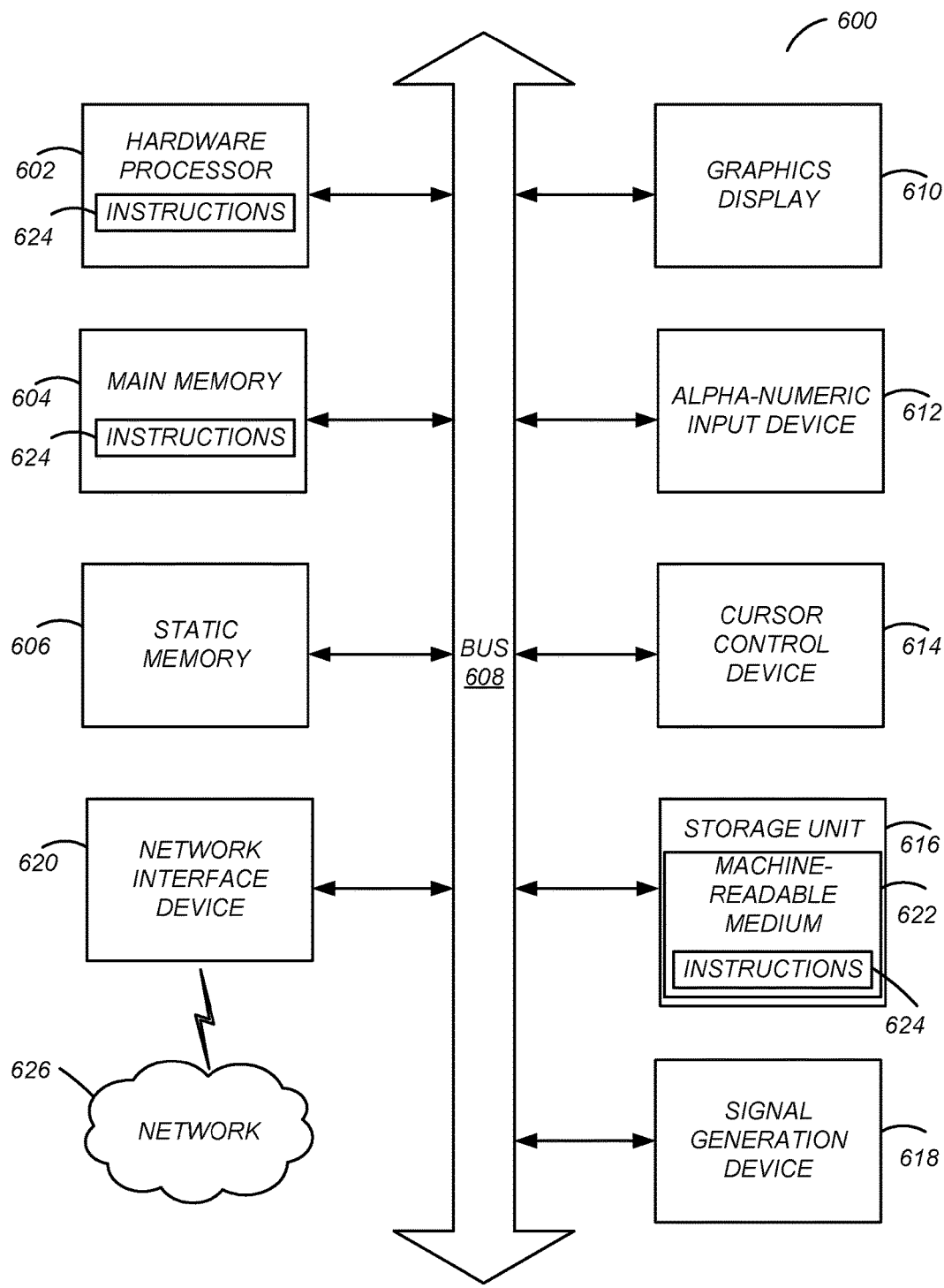
FIG. 6 illustrates one embodiment of components of an example machine able to read instructions from a machine-readable medium and execute them in a processor (or controller).

Turning now to FIG. 6, it is a block diagram illustrating components of an example machine able to read instructions from a machine-readable medium and execute them in a processor (or controller). Specifically, FIG. 6 shows a diagrammatic representation of a machine in the example form of a computer system 600 within which instructions 624 (e.g., software or program code) for causing the machine to perform (execute) any one or more of the methodologies described with FIGS. 1-5. The computer system 600 may be used for one or more of the entities (e.g., host system 110, emulator 120) illustrated in the emulation environment 100 of FIG. 1.

The example computer system 600 includes a hardware processor 602 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 604, and a static memory 606, which are configured to communicate with each other via a bus 608. The computer system 600 may further include graphics display unit 610 (e.g., a plasma display panel (PDP), a liquid crystal display (LCD), a projector, or a cathode ray tube (CRT)). The computer system 600 may also include alphanumeric input device 612 (e.g., a keyboard), a cursor control device 614 (e.g., a mouse, a trackball, a joystick, a motion sensor, or other pointing instrument), a storage unit 616, a signal generation device 618 (e.g., a speaker), and a network interface device 620, which also are configured to communicate via the bus 608.

The storage unit 616 includes a machine-readable medium 622 on which is stored instructions 624 (e.g., software) embodying any one or more of the methodologies or functions described herein. The instructions 624 (e.g., software) may also reside, completely or at least partially, within the main memory 604 or within the processor 602 (e.g., within a processor's cache memory) during execution thereof by the computer system 600, the main memory 604 and the processor 602 also constituting machine-readable media. The instructions 624 (e.g., software) may be transmitted or received over a network 626 via the network interface device 620.

While machine-readable medium 622 is shown in an example embodiment to be a single medium, the term "machine-readable medium" should be taken to include a single medium or multiple media (e.g., a centralized or distributed database, or associated caches and servers) able to store instructions (e.g., instructions 624). The term "machine-readable medium" shall also be taken to include any medium that is capable of storing instructions (e.g., instructions 624) for execution by the machine and that cause the machine to perform any one or more of the methodologies disclosed herein. The term "machine-readable medium" includes, but not be limited to, data repositories in the form of solid-state memories, optical media, and magnetic media.

As is known in the art, a computer system 600 can have different and/or other components than those shown in FIG. 6. In addition, the computer system 600 can lack certain illustrated components. For example, a computer system 600 acting as the emulator 120 may include a hardware processor 602, a storage unit 616, a network interface device 620, and multiple configurable logic circuits (as described above with reference to FIG. 1), among other components, but may lack an alphanumeric input device 612 and a cursor control device 614.

Additional Configuration Considerations

It is noted that although the subject matter is described in the context of emulation environment for emulation of digital circuits and systems, the principles described may be applied to fault analysis of any digital electronic devices. While the examples herein are in the context of an emulation environment, the principles described herein can apply to other analysis of hardware implementations of digital circuitries, including FPGA and ASIC or software simulation such as EDAs.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in FIGS. 1-8. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software (or computer program code)) may be driven by cost and time considerations.

The various operations of example methods described herein may be performed, at least partially, by one or more processors, e.g., processor 902, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for efficient power analysis of a digital circuit through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-transitory computer readable storage medium storing instructions, the instructions when executed by one or more processors cause the one or more processors to:
   receive, from an emulator, a plurality of interface signals, generated by tracing interfaces during a first emulation of a design under test (DUT);
   after the first emulation of the DUT, transmit to the emulator instructions to run a second emulation of at least a portion of the DUT and one or more interface signals from the plurality of interface signals; and
   receive, from the emulator, information generated during the second emulation based on the one or more interface signals from the plurality of interface signals to determine that the portion of the DUT emulated during the second emulation performs as expected.

2. The non-transitory computer readable storage medium of claim 1, wherein the one or more interface signals transmitted to the emulator are associated with a time period of the first emulation.

3. The non-transitory computer readable storage medium of claim 1, wherein the instructions to run the second emulation comprise instructions to run the second emulation for a time period corresponding to a time period of the first emulation, and the one or more interface signals transmitted to the emulator for the second emulation were traced during the time period of the first emulation.

4. The non-transitory computer readable storage medium of claim 1, wherein the instructions when executed by the one or more processors further cause the one or more processors to:
receive from a user a selection of a time period associated with the first emulation;
select, for transmittal to the emulator, the one or more interface signals from the plurality of interface signals, the selected one or more interface signals traced during the time period of the first emulation.

5. The non-transitory computer readable storage medium of claim 1, wherein an additional portion of the DUT is not emulated during the second emulation.

6. The non-transitory computer readable storage medium of claim 1, wherein the instructions when executed by the one or more processors further cause the one or more processors to display the information generated during the second emulation.

7. The non-transitory computer readable storage medium of claim 1, wherein the emulator includes a plurality of logic blocks and the plurality of interface signals are generated by tracing interfaces of the plurality of logic blocks.

8. The non-transitory computer readable storage medium of claim 1, wherein the emulator includes a plurality of field-programmable gate arrays (FPGAs) and the plurality of interface signals are generated by tracing interfaces of the plurality of FPGAs.

9. The non-transitory computer readable storage medium of claim 1, wherein the instructions when executed by the one or more processors further cause the one or more processors to:
store the plurality of interface signals;
receive a request to emulate an element of the DUT;
identify, from a plurality of field-programmable gate arrays (FPGAs) included in the emulator, a subset of FPGAs configured to emulate the element;
identify, from the plurality of stored interface signals, the one or more interface signals traced by the subset of FPGAs during the first emulation of the DUT; and
transmit the one or more interface signals to the emulator for running the subset of FPGAs.

10. A non-transitory computer readable storage medium storing instructions that configure an emulator to:
trace, during a first emulation of a design under test (DUT), interface signals exchanged between interfaces included in the emulator; and
after the first emulation of the DUT, run a second emulation using the traced interface signals in response to a request to emulate at least a portion of the DUT.

11. The non-transitory computer readable storage medium of claim 10, wherein the instructions further configure the emulator to:
transmit information generated during the second emulation based on the traced interface signals.

12. The non-transitory computer readable storage medium of claim 10, wherein the interface signals are associated with a time period of the first emulation.

13. The non-transitory computer readable storage medium of claim 10, wherein running the second emulation comprises running the second emulation for a time period corresponding to a time period of the first emulation, and the interface signals were traced during the time period of the first emulation.

14. The non-transitory computer readable storage medium of claim 10, wherein an additional portion of the DUT is not emulated during the second emulation.

15. The non-transitory computer readable storage medium of claim 10, wherein the emulator includes a plurality of field-programmable gate arrays (FPGAs) and the plurality of interface signals are generated by tracing interfaces of the plurality of FPGAs.

16. The non-transitory computer readable storage medium of claim 15, wherein a subset of the plurality of FPGAs are run during the second emulation, the subset of the plurality of FPGAs are configured to emulate the portion of the DUT.

17. A method comprising:
receiving, from an emulator, a plurality of interface signals, generated by tracing interfaces during a first emulation of a design under test (DUT);
after the first emulation of the DUT, transiting to the emulator instructions to run a second emulation of at least a portion of the DUT and one or more interface signals from the plurality of interface signals; and
receiving, from the emulator, information generated during the second emulation based on the one or more interface signals from the plurality of interface signals to determine that the portion of the DUT emulated during the second emulation performs as expected.

18. The method of claim 17, wherein the one or more interface signals transmitted to the emulator are associated with a time period of the first emulation.

19. The method of claim 17, wherein the instructions to run the second emulation comprise instructions to run the second emulation for a time period corresponding to a time period of the first emulation, and the one or more interface signals transmitted to the emulator for the second emulation were traced during the time period of the first emulation.

20. The method of claim 17, further comprising:
receiving from a user a selection of a time period associated with the first emulation;
selecting, for transmittal to the emulator, the one or more interface signals from the plurality of interface signals, the selected one or more interface signals traced during the time period of the first emulation.

* * * * *